United States Patent
Melanson et al.

(10) Patent No.: US 9,419,562 B1
(45) Date of Patent: Aug. 16, 2016

(54) SYSTEMS AND METHODS FOR MINIMIZING NOISE IN AN AMPLIFIER

(71) Applicant: Cirrus Logic, Inc., Austin, TX (US)

(72) Inventors: John L. Melanson, Austin, TX (US); John C. Tucker, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 121 days.

(21) Appl. No.: 14/248,054

(22) Filed: Apr. 8, 2014

Related U.S. Application Data

(60) Provisional application No. 61/810,075, filed on Apr. 9, 2013.

(51) Int. Cl.
- H03F 1/02 (2006.01)
- H03F 1/26 (2006.01)
- H03F 3/16 (2006.01)

(52) U.S. Cl.
CPC .. H03F 1/26 (2013.01); H03F 3/16 (2013.01); H03F 2200/372 (2013.01)

(58) Field of Classification Search
CPC .............. H03F 1/02; H03F 3/45; H03F 1/14
USPC ..................................... 330/9; 327/124, 307
See application file for complete search history.

(56) References Cited

U.S. PATENT DOCUMENTS

| | | | |
|---|---|---|---|
| 4,631,749 A | 12/1986 | Rapaich | |
| 5,243,345 A | 9/1993 | Naus et al. | |
| 5,247,210 A | 9/1993 | Swanson | |
| 5,603,088 A | 2/1997 | Gordray et al. | |
| 6,566,942 B2 * | 5/2003 | Shigenobu | H03F 3/45977 330/150 |
| 6,724,332 B1 | 4/2004 | Melanson | |
| 6,738,004 B2 | 5/2004 | Melanson | |
| 6,809,572 B2 | 10/2004 | Yi et al. | |
| 6,822,594 B1 | 11/2004 | Melanson et al. | |

(Continued)

FOREIGN PATENT DOCUMENTS

| | | |
|---|---|---|
| CN | 105264777 A | 1/2016 |
| EP | 0173983 A2 | 3/1986 |

(Continued)

OTHER PUBLICATIONS

International Search Report and Written Opinion, International Application No. PCT/US2014/033314, Nov. 7, 2014, 17 pages.

(Continued)

*Primary Examiner* — Henry Choe
(74) *Attorney, Agent, or Firm* — Jackson Walker L.L.P.

(57) ABSTRACT

An amplifier may include a plurality of stages, wherein each stage may have an amplifier stage output configured to generate an amplifier output signal and a transistor coupled at its gate terminal to the amplifier input and to the gate terminals of the transistors of the other amplifier stages. Each stage may be configured to periodically and cyclically operate in an amplifier mode in which the amplifier stage generates at its corresponding amplifier stage output a power-amplified version of a signal received at the amplifier input and a in reset mode in which the transistor of the stage operating in the reset mode has an electrical property thereof reset. At any given time, at least one amplifier stage is operating in the amplifier mode. The amplifier may be configured to output as an output signal one of the amplifier output signals corresponding to an amplifier stage operating in the amplifier mode.

18 Claims, 2 Drawing Sheets

(56) References Cited

U.S. PATENT DOCUMENTS

| | | | |
|---|---|---|---|
| 6,879,275 B1 | 4/2005 | Melanson | |
| 6,933,871 B2 | 8/2005 | Melanson et al. | |
| 6,956,919 B2 | 10/2005 | Amar et al. | |
| 7,081,843 B2 | 7/2006 | Melanson | |
| 7,084,798 B2 | 8/2006 | Melanson | |
| 7,110,460 B1 | 9/2006 | Melanson et al. | |
| 7,116,721 B1 | 10/2006 | Melanson et al. | |
| 7,138,934 B2 | 11/2006 | Melanson | |
| 7,148,830 B2 | 12/2006 | Melanson | |
| 7,164,379 B1* | 1/2007 | Rao | H03M 1/52 341/155 |
| 7,170,434 B2 | 1/2007 | Melanson | |
| 7,183,957 B1 | 2/2007 | Melanson | |
| 7,187,312 B2 | 3/2007 | Melanson | |
| 7,190,294 B2 | 3/2007 | Melanson | |
| 7,196,647 B2 | 3/2007 | Melanson | |
| 7,205,917 B2 | 4/2007 | Magrath | |
| 7,298,305 B2 | 11/2007 | Melanson | |
| 7,358,881 B2 | 4/2008 | Melanson | |
| 7,450,047 B1 | 11/2008 | Wu | |
| 7,649,484 B1 | 1/2010 | Wegener | |
| 8,396,230 B2 | 3/2013 | Chang et al. | |
| 8,890,051 B2* | 11/2014 | Funakoshi | G01J 1/46 250/214 A |
| 8,907,829 B1 | 12/2014 | Naderi | |
| 9,076,554 B1* | 7/2015 | Zanchi | G11C 27/026 |
| 9,076,654 B2 | 7/2015 | Zanchi | |
| 2001/0014122 A1 | 8/2001 | Fu et al. | |
| 2009/0278721 A1 | 11/2009 | Hamashita | |
| 2009/0295615 A1 | 12/2009 | Steiner | |
| 2010/0057474 A1 | 3/2010 | Kong | |
| 2011/0112668 A1 | 5/2011 | Sorensen et al. | |
| 2011/0150260 A1 | 6/2011 | Miles | |
| 2012/0128181 A1 | 5/2012 | Lin et al. | |
| 2012/0224722 A1 | 9/2012 | Nystrom | |
| 2013/0051582 A1 | 2/2013 | Kropfitsch et al. | |
| 2013/0058495 A1 | 3/2013 | Furst | |
| 2013/0108074 A1 | 5/2013 | Reining | |
| 2013/0271307 A1 | 10/2013 | Kropfitsch et al. | |
| 2013/0335131 A1 | 12/2013 | Ceballos et al. | |
| 2014/0140538 A1 | 5/2014 | Kropfitsch et al. | |
| 2014/0301571 A1 | 10/2014 | Melanson et al. | |
| 2014/0301572 A1 | 10/2014 | Melanson et al. | |
| 2014/0323844 A1* | 10/2014 | Deliwala | H01L 31/02019 600/407 |
| 2014/0341397 A1 | 11/2014 | Straeussnigg et al. | |
| 2015/0086043 A1 | 3/2015 | Sridharan et al. | |
| 2015/0380005 A1 | 12/2015 | Chesney | |

FOREIGN PATENT DOCUMENTS

| | | |
|---|---|---|
| EP | 2421281 A2 | 2/2012 |
| EP | 2984759 A2 | 2/2016 |
| EP | 2984760 A2 | 2/2016 |
| GB | 2459862 A | 11/2009 |
| GB | 2459864 A | 11/2009 |
| GB | 2508612 A | 6/2014 |
| GB | 2513406 A | 10/2014 |
| GB | 2530605 A | 3/2016 |
| WO | 2013182901 A1 | 12/2013 |
| WO | 2014168934 A2 | 10/2014 |
| WO | 2014168939 A2 | 10/2014 |
| WO | 2014174283 A1 | 10/2014 |
| WO | 2015200267 A2 | 12/2015 |

OTHER PUBLICATIONS

International Search Report and Written Opinion, International Application No. PCT/US2014/033302, Nov. 7, 2014, 10 pages.

Bloom, I. and Nemirovsky, Y.; 1/f Noise Reduction of Metal-Oxide-Semiconductor Transistors by Cycling from Inversion to Accumulation, Appl. Phys. Lett. 48 (15), Apr. 15, 1991, American Institute of Physics, pp. 1164-1666.

Koh, Jeongwook; Low-Frequency-Noise Reduction Technique for Linear Analog CMOS IC's, Dissertation, Lehrstuhl fur Technische Elektroniks der Technischen Universitat Munchen; 2005, 113 pages.

Kolhatkar, J.S., Salm, C., Knitel, M.J., and Wallinga, H.; Constant and Switched Bias Low Frequency Noise in p-MOSFETs with Varying Gate Oxide Thickness ESSDERC 2002, pp. 83-86.

Ersoy, Selcuk, Van Veldhoven, Robert H.M., Sebastiano, Fabio, Reimann, Klaus, Makinwa, Kofi A.A.; A 0.25mm2 AC-Biased MEMS Microphone Interface with 28dBA SNR, ISSCC 2013 / Session 22 / Sensors & Displays / 22.2, 2013 IEEE International Solid-State Circuits Conference, Digest of Technical Papers, Feb. 20, 2013, pp. 382-383.

International Search Report and Written Opinion, International Application No. PCT/GB2014/051262, Sep. 22, 2014, 18 pages.

Search Report under Section 17, GB Patent Application No. GB1307576.7, Oct. 9, 2013, 3 pages.

Zhou, et al., Precompensated excitation waveforms to suppress harmonic generation in MEMS electrostatic transducers, IEEE Transactions on Ultrasonics, Ferroelectrics and Frequency Control, vol. 51, Issue 11, Nov. 2004, pp. 1564-1574.

Jawed, Syed Arsalan, CMOS Readout Interfaces for MEMS Capacitive Microphones, Mar. 31, 2009, Retrieved from the Internet: http://eprints-phd.biblio.unitn.it/82/1/thesis_mems_microphone_readout.pdf.

O'Neal, J.B., Delta Modulation Quantizing Noise Analytical and Computer Simulation Results for Gaussian and Television Input Signals, Bell Systems Technical Journal, Jan. 1966, pp. 117-141.

International Search Report and Written Opinion, International Application No. PCT/US2015/037101, mailed Jan. 4, 2016, 20 pages.

Anonymous: Data compression—Wikipedia, the free encyclopedia, Jun. 17, 2014, Retrieved from the Internet: https://en.wikipedia.org/w/index.php?title=Data_compression&oldid=613257125 [retrieved on Oct. 5, 2015], pp. 1-3, 7-9.

Anonymous: Lossless compression—Wikipedia, the free encyclopedia, Jun. 18, 2014, Retrieved from the Internet: https://en.wikipedia.org/w/index.php?title=Lossless_compression&oldid=613463592 [retrieved on Oct. 5, 2015], pp. 2-3, 5-6.

Abadi et al., Integrating compression and execution in column-oriented database systems, ACM Proceedings of SIGMOD. International Conference on Management of Data, Jun. 27, 2006, pp. 671-682.

Combined Search and Examination Report under Sections 17 and 18(3), Application No. GB1511091.9, mailed Jan. 21, 2016, 8 pages.

Colodro, Francisco et al., New Continuous-Time Multibit Sigma-Delta Modulators with Low Sensitivity to Clock Jitter, IEEE Transactions on Circuits and Systems I: Regular Papers, IEEE, U.S vol. 56, No. 1, Jan. 1, 2009, pp. 74-83.

Muda, Lindasalwa et al., Voice Recognition Algorithms using Mel Frequency Ceptral Coefficient (MFCC) and Dynamic Time Warping (DTW) Techniques, Journal of Computing (vol. 2, Issue 3), Mar. 22, 2010, pp. 138-143.

Eshraghi, A et al., A Comparison of Three Parallel Delta-Sigma A/D Converters, 1996 IEEE International Symposium on Circuits and Systems (ISCAS), IEEE, U.S., May 12, 1996, pp. 517-520.

International Search Report and Written Opinion, International Application No. PCT/US2015/037101, mailed Mar. 23, 2016, 23 pages.

* cited by examiner

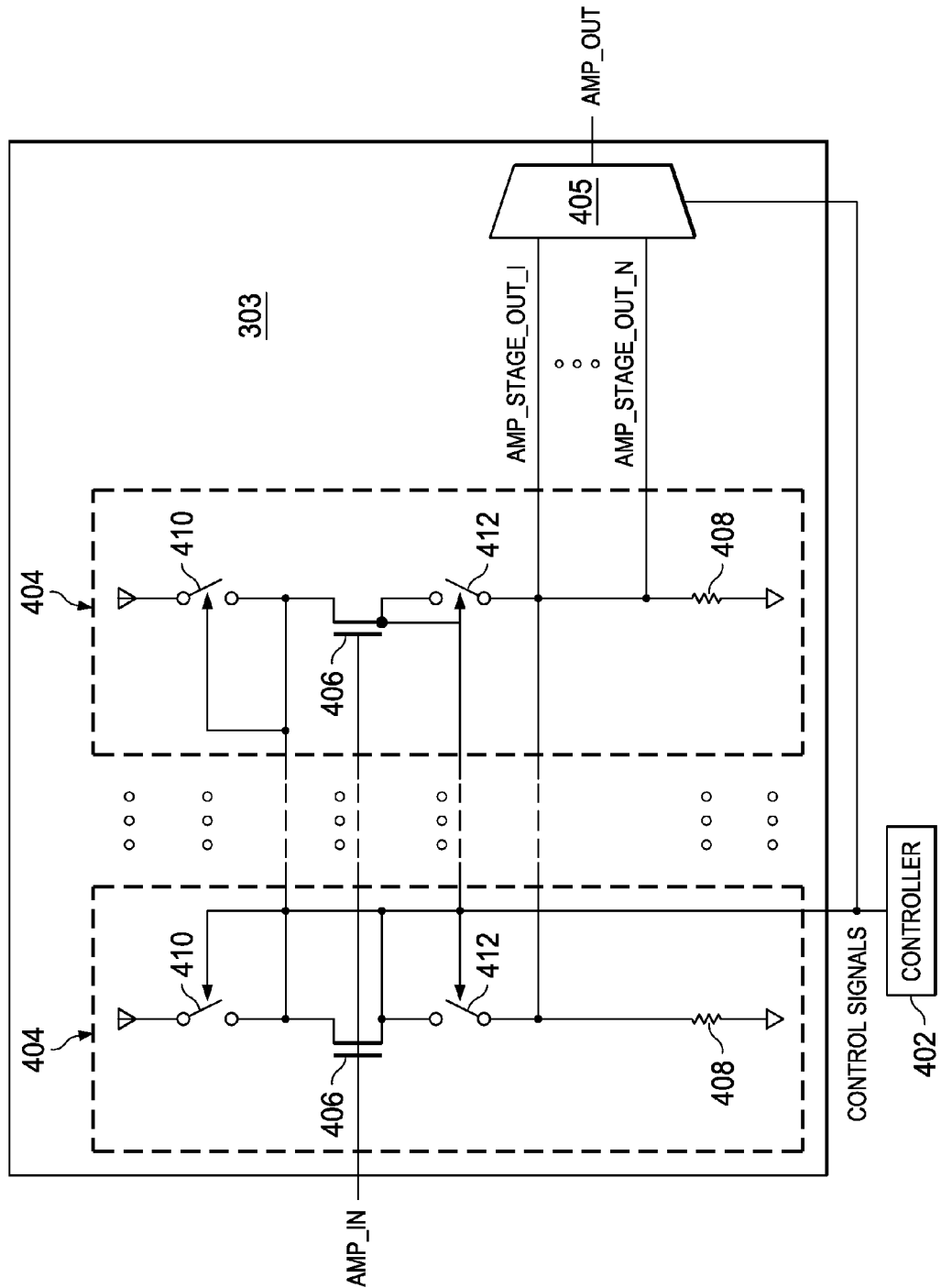

SYSTEMS AND METHODS FOR MINIMIZING NOISE IN AN AMPLIFIER

RELATED APPLICATIONS

The present disclosure claims priority to U.S. Provisional Patent Application Ser. No. 61/810,075, filed Apr. 9, 2013, which is incorporated by reference herein in its entirety.

FIELD OF DISCLOSURE

The present disclosure relates in general to audio systems, and more particularly, to reducing noise in an electrical signal amplified by an amplifier.

BACKGROUND

Analog amplifiers and pre-amplifiers are often used in electronic devices to apply a multiplicative gain to a signal, in order to better condition such signal for processing by subsequent elements of a signal path. For example, pre-amplifiers may be used as part of an analog front end of a signal path in an audio system (e.g., a digital microphone system). An example of such an amplifier is the source-follower amplifier 100 shown in FIG. 1. The amplifier 100 may include an n-type field-effect transistor 102 coupled at its drain to a voltage supply, and coupled at its source to a resistor 104, which is in turn coupled to an electrical ground. In operation, amplifier 100 may receive a signal IN at a gate terminal of transistor 102 and output an output signal OUT at the source terminal of transistor 102 which is an amplified version of input signal IN.

It has been observed in transistors that during normal amplifier operation, an effect known as "charge trapping" may occur, which may alter the threshold voltage of a transistor, adding flicker noise to the output of the system. Flicker noise is a type of electronic noise with a 1/f power density spectrum over a frequency f, and is also sometimes referred to as 1/f noise. This noise is undesirable, especially in precision amplifier systems.

SUMMARY

In accordance with the teachings of the present disclosure, certain disadvantages and problems associated with noise generated in an amplifier may be reduced or eliminated.

In accordance with embodiments of the present disclosure, a system may include an amplifier and a controller. The amplifier may have an amplifier input configured to receive an amplifier input signal and may include a plurality of amplifier stages, each amplifier stage having an amplifier stage output configured to generate an amplifier output signal and comprising a transistor coupled at its gate terminal to the amplifier input and to the gate terminals of the transistors of the other amplifier stages. Each amplifier stage may be configured to operate in a plurality of modes including an amplifier mode in which the amplifier stage generates at its corresponding amplifier stage output a power-amplified version of a signal received at the amplifier input and a reset mode in which the transistor of the amplifier stage operating in the reset mode has an electrical property thereof reset. The controller may be coupled to the plurality of amplifier stages and configured to individually control each of the plurality of amplifier stages such that each amplifier stage is periodically and cyclically operated in the amplifier mode and the reset mode, and such that, at any given time, at least one amplifier stage is operating in the amplifier mode. The amplifier may be configured to output as an output signal one of the amplifier output signals corresponding to an amplifier stage operating in the amplifier mode.

In accordance with these and other embodiments of the present disclosure, a method may include individually operating each of a plurality of amplifier stages of an amplifier between an amplifier mode and a reset mode, such that, at any given time, at least one amplifier stage is operating in the amplifier mode. When operating in the amplifier mode, an amplifier stage generates at its corresponding amplifier stage output a power-amplified version of a signal received at the amplifier input. When operating in the reset mode, the transistor of an amplifier stage operating in the reset mode has an electrical property thereof reset. The method may further include outputting as an output signal of the amplifier one of the amplifier stage output signals corresponding to an amplifier stage operating in the amplifier mode.

In accordance with these and other embodiments of the present disclosure, an integrated circuit may include a controller. The controller may be configured to individually operate each of a plurality of amplifier stages of an amplifier between an amplifier mode and a reset mode, such that, at any given time, at least one amplifier stage is operating in the amplifier mode. When operating in the amplifier mode, an amplifier stage may generate at its corresponding amplifier stage output a power-amplified version of a signal received at the amplifier input. When operating in the reset mode, the transistor of an amplifier stage operating in the reset mode may have an electrical property thereof reset. The amplifier may output as an output signal of the amplifier one of the amplifier stage output signals corresponding to an amplifier stage operating in the amplifier mode.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 4 illustrates a block diagram of selected components of an amplifier, in accordance with embodiments of the present disclosure.

DETAILED DESCRIPTION

Figure 1:
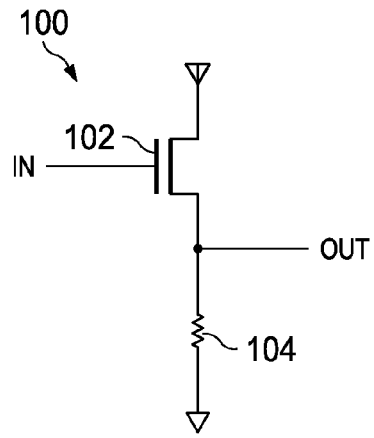
FIG. 1 illustrates a block diagram of a source-follower amplifier, as in known in the art.
Figure 2:
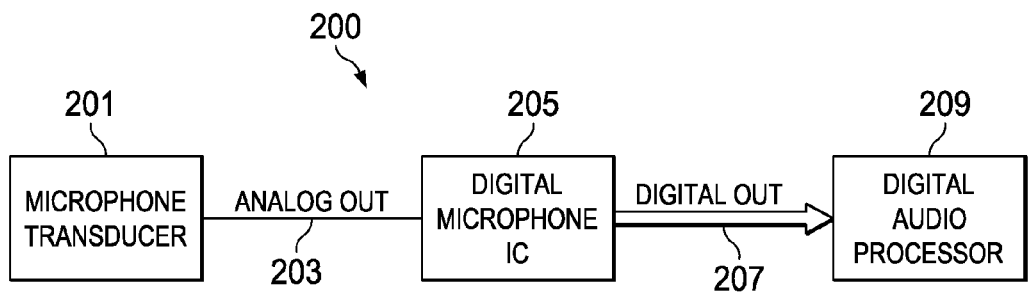
FIG. 2 illustrates a block diagram of selected components of an example audio system, in accordance with embodiments of the present disclosure.

FIG. 2 illustrates a block diagram of selected components of an example audio system 200, in accordance with embodiments of the present disclosure. As shown in FIG. 2, audio system 200 may include a microphone transducer 201, a digital microphone integrated circuit (IC) 205, and a digital audio processor 209. Microphone transducer 201 may comprise any system, device, or apparatus configured to convert sound incident at microphone transducer 201 to an electrical signal, for example analog output signal 203, wherein such sound is converted to an electrical signal using a diaphragm or membrane having an electrical capacitance that varies based on sonic vibrations received at the diaphragm or membrane. Microphone transducer 201 may include an electrostatic microphone, a condenser microphone, an electret microphone, a microelectromechanical systems (MEMs) microphone, or any other suitable capacitive microphone.

Digital microphone IC 205 may comprise any suitable system, device, or apparatus configured to process analog output signal 203 to generate a digital audio output signal 207 and condition digital audio output signal 207 for transmission over a bus to digital audio processor 209. Once converted to digital audio output signal 207, the audio signal may be transmitted over significantly longer distances without being susceptible to noise as compared to an analog transmission over the same distance. In some embodiments, digital microphone IC 205 may be disposed in close proximity with microphone transducer 201 to ensure that the length of the analog line between microphone transducer 201 and digital microphone IC 205 is relatively short to minimize the amount of noise that can be picked up on an analog output line carrying analog output signal 203. For example, in some embodiments, microphone transducer 201 and digital microphone IC 205 may be formed on the same integrated circuit die or substrate.

Digital audio processor 209 may comprise any suitable system, device, or apparatus configured to process digital audio output signal 207 for use in a digital audio system. For example, digital audio processor 209 may comprise a microprocessor, microcontroller, digital signal processor (DSP), application specific integrated circuit (ASIC), or any other device configured to interpret and/or execute program instructions and/or process data, such as digital audio output signal 207.

Figure 3:
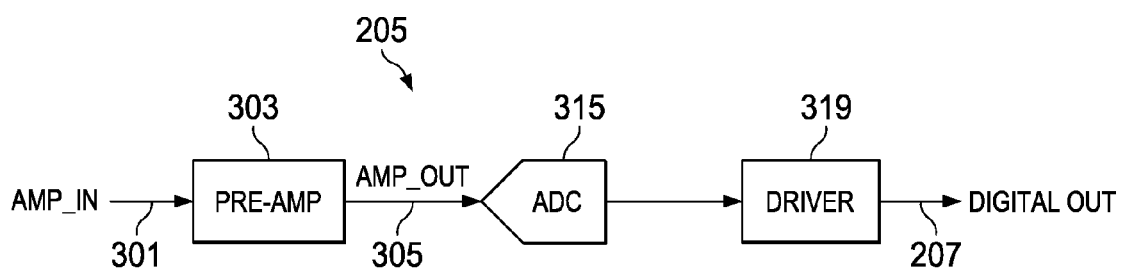
FIG. 3 illustrates a block diagram of selected components of a digital microphone integrated circuit, in accordance with embodiments of the present disclosure.

FIG. 3 illustrates a block diagram of selected components of digital microphone IC 205, in accordance with embodiments of the present disclosure. As shown in FIG. 3, digital microphone IC 205 may include a pre-amplifier 303, an analog-to-digital converter (ADC) 315, and a driver 319. Pre-amplifier 303 may receive an amplifier input signal AMP_IN (which may be the same as or equivalent to analog output signal 203) via one or more input lines 301 which may allow for receipt of a single-ended signal, differential signal, or any other suitable analog audio signal format and may comprise any suitable system, device, or apparatus configured to condition analog output signal 203 for processing by ADC 315. The output signal AMP_OUT of pre-amplifier 303 may be communicated to ADC 315 on one or more output lines 305. Thus, pre-amplifier 303 may function as part of an analog front end of audio system 200.

ADC 315 may comprise any suitable system, device, or apparatus configured to convert an analog audio signal received at its input, to a digital signal representative of analog output signal 203. ADC 315 may itself include one or more components (e.g., delta-sigma modulator, decimator, etc.) for carrying out the functionality of ADC 315.

Driver 319 may receive the digital signal output by ADC 315 and may comprise any suitable system, device, or apparatus configured to condition such digital signal (e.g., encoding into Audio Engineering Society/European Broadcasting Union (AES/EBU), Sony/Philips Digital Interface Format (S/PDIF), or other suitable audio interface standards), in the process generating digital audio output signal 207 for transmission over a bus to digital audio processor 209. In FIG. 3, the bus receiving digital audio output signal 207 is shown as single-ended. In some embodiments, driver 319 may generate a differential digital audio output signal 207.

FIG. 4 illustrates a block diagram of selected components of an amplifier, which may be used to implement pre-amplifier 303 depicted in FIG. 3, and a controller 402 for controlling the operation thereof, in accordance with embodiments of the present disclosure. As shown in FIG. 4, amplifier 303 may include a plurality of amplifier stages 404 and a selector 405 coupled to the amplifier stages.

Each amplifier stage 404 may comprise a suitable type of amplifier circuit. For example, in the embodiments depicted in FIG. 4, each amplifier stage 404 may comprise an amplifier circuit configured in a source-follower amplifier configuration, and thus may include an n-type field-effect transistor 406 coupled at its drain to a voltage supply via a switch 410, and coupled at its source to a resistor 408 via a switch 412, wherein resistor 408 is in turn coupled to an electrical ground. The transistor 406 of such amplifier stage 404 may also be coupled at its gate terminal to the gate terminal of all other transistors 406 of other amplifier stages 404. In operation within an amplifier mode (as discussed in greater detail below) in which switches 410 and 412 are activated (e.g., closed or enabled), an amplifier stage 404 may receive amplifier input signal AMP_IN at a gate terminal of its transistor 406 and output an amplifier stage output signal (e.g., AMP_STAGE_OUT_1, AMP_STAGE_OUT_N) at the source terminal of its transistor 406 which is an amplified version of amplifier input signal AMP_IN.

Selector 405 may be configured to receive the various amplifier stage output signals generated by the various amplifier stages 404, and select, based on one or more control signals from controller 402, one of the amplifier stage output signals as amplifier output signal AMP_OUT. In some embodiments, selector 405 may comprise a multiplexer, as shown in FIG. 4.

Controller 402 may comprise any suitable system, device, or apparatus for controlling operating modes of amplifier stages 404 and controlling selector 405, as described in more detail below. An amplifier stage 404 may operate in two or more modes, such two or more modes including an amplifier mode and a reset mode. In the amplifier mode, an amplifier stage 404 generates at its corresponding amplifier stage output a power-amplified version of amplifier input signal AMP_IN received at the amplifier input of pre-amplifier 303. To operate an amplifier stage 404 in the amplifier mode, controller 402 may generate control signals for activating (e.g., closing, enabling) switches 410 and 412 of the amplifier stage 404.

In the reset mode of an amplifier stage 404, controller 402 operates the amplifier stage 404 such that an electrical property (e.g., threshold voltage, charge trapping effect, etc.) of the transistor 406 of the amplifier stage 404 is reset to a known state. To operate an amplifier stage 404 in the reset mode, controller 402 may generate control signals for deactivating (e.g., opening, disabling) switches 410 and 412 of the amplifier stage 404. In addition, during the reset mode, controller 402 may apply a corresponding reset voltage to each of one or more non-gate terminals (e.g., source and drain terminals) of the transistor 406 of the amplifier stage 404 operating in the reset mode such that the reset voltage is of substantially different magnitude than that applied to such non-gate terminal during operating in the amplifier mode of such amplifier stage 404. Such resetting of a transistor may comprise switching such transistor 406 from its inversion state to its accumulation state. For example, the reset voltage may be of substantially higher magnitude (e.g., 1.5×, 2×, etc.) than that applied to the non-gate terminal during operating in the amplifier mode of such amplifier stage 404. In a particular example, a transistor 406 may be reset by opening switch 412 and coupling the source of the transistor to the supply voltage applied to the drain of the transistor. As another example, the reset voltage may be of a substantially lower magnitude (e.g., 0-25%) than that applied to the non-gate terminal during operating in the amplifier mode of such amplifier stage 404. In some embodiments, the reset voltages applied to the source and drain terminals of a transistor 406 may be approximately the same; in other embodiments, the reset voltages applied to the source and drain terminals of a transistor 406 may be substantially different. As a further example, one or more techniques similar or identical to those described in U.S. Pat. No. 5,247,210, filed Jul. 26, 1991 (which is incorporated herein), may be used to reset a transistor 406. The effect of such resetting in the reset mode may be to reset an amount of trapped charge in a transistor 406 to a known state. By doing so at a rate greater than the audio band frequency, the low-frequency noise may be significantly reduced, as much of the low-frequency noise is related to effects of the stored charge.

Controller 402 may individually control each of the plurality of amplifier stages 404 such that each amplifier stage 404 is periodically and cyclically operated in the amplifier mode and the reset mode, and such that, at any given time, at least one amplifier stage 404 is operating in the amplifier mode. For example, controller 402 may simply alternate operation in the reset mode among each amplifier stage 404. As a specific example, with three amplifier stages 406, during regular intervals, (e.g., at a frequency more than the audio band frequency), controller may within each interval operate two amplifier stages 406 in the reset mode and one in the amplifier mode, and during successive intervals, selecting a different amplifier stage 406 for operation in the amplifier mode. Thus, controller 402 may regularly reset each transistor 406, while at all times leaving at least one amplifier stage 404 in amplifier mode, such that pre-amplifier 303 may continue to generate a usable output signal despite elements thereof undergoing reset operations. In connection therewith, controller 402 may also generate one or more control signals such that selector 405 may selectively output a selected output signal selected from one of the amplifier stage output signals corresponding to an amplifier stage 404 operating in the amplifier mode. As there is capacitive coupling from the source and drain of each transistor 406 to its respective gate terminal, the sequencing may preferably be operated in such a way that one amplifier stage 404 is transitioned from the amplifier mode to reset mode coincident in time with amplifier stage transitioning from the reset mode to amplification mode, which allow biasing perturbations caused by capacitive coupling to cancel out.

Although the foregoing disclosure contemplates use of an amplifier as a preamplifier in an audio system including a digital microphone, the amplifier shown in FIG. 4, and equivalents thereof, may be used in or applied to any suitable electronic system in which an analog amplifier may be utilized.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A system comprising:
    an amplifier having an amplifier input configured to receive an amplifier input signal and comprising a plurality of amplifier stages, each amplifier stage having an amplifier stage output configured to generate an amplifier stage output signal and comprising a transistor coupled at its gate terminal to the amplifier input and to the gate terminals of the transistors of the other amplifier stages, wherein each amplifier stage is configured to operate in a plurality of modes including:
        an amplifier mode in which the amplifier stage generates at its corresponding amplifier stage output a power-amplified version of a signal received at the amplifier input; and
        a reset mode in which the transistor of the amplifier stage operating in the reset mode has an electrical property thereof reset; and
    a controller coupled to the plurality of amplifier stages and configured to individually control each of the plurality of amplifier stages such that each amplifier stage is periodically operated in the amplifier mode and the reset mode, and such that, at any given time, at least one amplifier stage is operating in the amplifier mode; and
    wherein the amplifier outputs as an output signal one of the amplifier stage output signals corresponding to an amplifier stage operating in the amplifier mode.

2. The system of claim 1, wherein the amplifier further comprises a selector coupled to the plurality of amplifier stages and configured to selectively output a selected output signal selected from one of the amplifier stage output signals corresponding to an amplifier stage operating in the amplifier mode.

3. The system of claim 1, wherein during the reset mode, a reset voltage is applied to a non-gate terminal of the transistor integral to the amplifier stage operating in the reset mode such that the reset voltage is of substantially different magnitude than that applied to the non-gate terminal during operating in the amplifier mode of such amplifier stage.

4. The system of claim 3, wherein the reset voltage is of a substantially higher magnitude than that applied to the non-gate terminal during operating in the amplifier mode of such amplifier stage.

5. The system of claim 3, wherein the reset voltage is of a substantially lower magnitude than that applied to the non-gate terminal during operating in the amplifier mode of such amplifier stage.

6. The system of claim 1, wherein resetting of a transistor in the reset mode reduces a charge trapping effect of the transistor.

7. A method comprising:
individually operating each of a plurality of amplifier stages of an amplifier, each amplifier stage having an amplifier stage input configured to receive an amplifier input of the amplifier and having an amplifier stage output configured to generate an amplifier stage output signal, between an amplifier mode and a reset mode, such that, at any given time, at least one amplifier stage is operating in the amplifier mode, wherein:
when operating in the amplifier mode, an amplifier stage generates at its corresponding amplifier stage output a power-amplified version of a signal received at the amplifier input; and
when operating in the reset mode, a transistor of an amplifier stage operating in the reset mode has an electrical property thereof reset;
when operating in both of the amplifier mode and the reset mode, an amplifier stage is electrically coupled at its amplifier stage input to at least one other amplifier stage input of at least one other of the plurality of amplifier stages; and
outputting as an output signal of the amplifier one of the amplifier stage output signals corresponding to an amplifier stage operating in the amplifier mode.

8. The method of claim 7, further comprising selectively outputting a selected output signal selected from one of the amplifier stage output signals corresponding to an amplifier stage operating in the amplifier mode.

9. The method of claim 7, further comprising, during the reset mode, applying a reset voltage to a non-gate terminal of the transistor integral to the amplifier stage operating in the reset mode such that the reset voltage is of substantially different magnitude than that applied to the non-gate terminal during operating in the amplifier mode of such amplifier stage.

10. The method of claim 9, wherein the reset voltage is of a substantially higher magnitude than that applied to the non-gate terminal during operating in the amplifier mode of such amplifier stage.

11. The method of claim 9, wherein the reset voltage is of a substantially lower magnitude than that applied to the non-gate terminal during operating in the amplifier mode of such amplifier stage.

12. The method of claim 7, wherein resetting of a transistor in the reset mode reduces a charge trapping effect of the transistor.

13. An integrated circuit comprising:
a controller configured to individually operate each of a plurality of amplifier stages of an amplifier, each amplifier stage having an amplifier stage input configured to receive an amplifier input of the amplifier and having an amplifier stage output configured to generate an amplifier stage output signal, between an amplifier mode and a reset mode, such that, at any given time, at least one amplifier stage is operating in the amplifier mode, wherein:
when operating in the amplifier mode, an amplifier stage generates at its corresponding amplifier stage output a power-amplified version of a signal received at the amplifier input;
when operating in the reset mode, the transistor of an amplifier stage operating in the reset mode has an electrical property thereof reset;
when operating in both of the amplifier mode and the reset mode, an amplifier stage is electrically coupled at its amplifier stage input to at least one other amplifier stage input of at least one other of the plurality of amplifier stages; and
the amplifier outputs as an output signal of the amplifier one of the amplifier stage output signals corresponding to an amplifier stage operating in the amplifier mode.

14. The integrated circuit of claim 13, wherein the controller is configured to control a selector coupled to the plurality of amplifier stages and configured to selectively output a selected output signal selected from one of the amplifier stage output signals corresponding to an amplifier stage operating in the amplifier mode.

15. The integrated circuit of claim 13, wherein during the reset mode, the controller is configured to apply a reset voltage to a non-gate terminal of the transistor integral to the amplifier stage operating in the reset mode such that the reset voltage is of substantially different magnitude than that applied to the non-gate terminal during operating in the amplifier mode of such amplifier stage.

16. The integrated circuit of claim 15, wherein the reset voltage is of a substantially higher magnitude than that applied to the non-gate terminal during operating in the amplifier mode of such amplifier stage.

17. The integrated circuit of claim 15, wherein the reset voltage is of a substantially lower magnitude than that applied to the non-gate terminal during operating in the amplifier mode of such amplifier stage.

18. The integrated circuit of claim 13, wherein resetting of a transistor in the reset mode reduces a charge trapping effect of the transistor.

* * * * *